US011355602B2

(12) United States Patent
Inokuchi et al.

(10) Patent No.: US 11,355,602 B2
(45) Date of Patent: Jun. 7, 2022

(54) SEMICONDUCTOR DEVICE HAVING MULTIPLE CONDUCTIVE PARTS

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tomoaki Inokuchi, Yokohama Kanagawa (JP); Hiro Gangi, Ota Tokyo (JP); Yusuke Kobayashi, Nagareyama Chiba (JP); Masahiko Kuraguchi, Yokohama Kanagawa (JP); Kazuto Takao, Tsukuba Ibaraki (JP); Ryosuke Iijima, Setagaya Tokyo (JP); Tatsuo Shimizu, Shinagawa Tokyo (JP); Tatsuya Nishiwaki, Komatsu Ishikawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/015,474

(22) Filed: Sep. 9, 2020

(65) Prior Publication Data
US 2021/0257469 A1    Aug. 19, 2021

(30) Foreign Application Priority Data

Feb. 18, 2020 (JP) .............................. JP2020-025596
Jul. 22, 2020 (JP) .............................. JP2020-125240

(51) Int. Cl.
*H01L 29/417* (2006.01)
*H01L 29/08* (2006.01)
(Continued)

(52) U.S. Cl.
CPC .... *H01L 29/41775* (2013.01); *H01L 29/0847* (2013.01); *H01L 29/872* (2013.01)

(58) Field of Classification Search
CPC .......... H01L 29/66666; H01L 29/66681; H01L 29/66734; H01L 29/7827; H01L 29/7828;
(Continued)

(56) References Cited

U.S. PATENT DOCUMENTS 7,642,597 B2    1/2010   Saito
8,080,858 B2    12/2011  Hirler et al.
(Continued)

FOREIGN PATENT DOCUMENTS

JP    2008-103683 A    5/2008
JP    2008-124346 A    5/2008
(Continued)

OTHER PUBLICATIONS

Mirchandani et al., "A Novel N-Channel MOSFET Featuring an Integrated Schottky and No Internal P-N Junction," Proceedings of 2004 International Symposium on Power Semiconductor Devices & ICs (2004), pp. 405-408.
(Continued)

*Primary Examiner* — Sonya McCall-Shepard
(74) *Attorney, Agent, or Firm* — Finnegan, Henderson, Farabow, Garrett & Dunner L.L.P.

(57) ABSTRACT

According to one embodiment, a semiconductor device includes first, second and third conductive parts, a first semiconductor region, and a first insulating part. A direction from the first conductive part toward the second conductive part is along a first direction. The first semiconductor region includes first, second, and third partial regions. A second direction from the first partial region toward the second partial region crosses the first direction. The third partial region is between the first partial region and the second
(Continued)

conductive part in the first direction. The third partial region includes an opposing surface facing the second conductive part. A direction from the opposing surface toward the third conductive part is along the second direction. The first insulating part includes a first insulating region. At least a portion of the first insulating region is between the opposing surface and the third conductive part.

19 Claims, 10 Drawing Sheets

(51) Int. Cl.
*H01L 29/872* (2006.01)
*H01L 29/739* (2006.01)
*H01L 29/06* (2006.01)
*H01L 29/40* (2006.01)
*H01L 29/78* (2006.01)

(58) Field of Classification Search
CPC ........... H01L 29/7813; H01L 29/42356; H01L 29/4236; H01L 29/7839; H01L 29/806; H01L 29/6609; H01L 29/6612; H01L 29/66325–66348; H01L 29/66234; H01L 29/66257; H01L 29/1004; H01L 29/1095; H01L 29/08–0843; H01L 29/0649–0653; H01L 29/7395–7397; H01L 29/06; H01L 29/0603; H01L 29/0607; H01L 29/0638; H01L 29/06042; H01L 29/0646; H01L 29/36

See application file for complete search history.

(56) References Cited

U.S. PATENT DOCUMENTS

| | | |
|---|---|---|
| 9,525,059 B1 | 12/2016 | Kobayashi |
| 2008/0197407 A1 | 8/2008 | Challa et al. |
| 2016/0079238 A1* | 3/2016 | Siemieniec ......... H01L 29/7806 257/140 |

FOREIGN PATENT DOCUMENTS

| | | |
|---|---|---|
| JP | 2008-227514 A | 9/2008 |
| JP | 6400545 B2 | 10/2018 |

OTHER PUBLICATIONS

Sugahara et al., "A spin metal-oxide-semiconductor field-effect transistor using half-metallic-ferromagnet contacts for the source and drain," Applied Physics Letters, vol. 84, No. 13, pp. 22307-22309 (2004).

* cited by examiner

SEMICONDUCTOR DEVICE HAVING MULTIPLE CONDUCTIVE PARTS

CROSS-REFERENCE TO RELATED APPLICATIONS

This application is based upon and claims the benefit of priority from Japanese Patent Application No. 2020-025596, filed on Feb. 18, 2020 and Japanese Patent Application No. 2020-125240, filed on Jul. 22, 2020; the entire contents of which are incorporated herein by reference.

FIELD

Embodiments of the invention generally relate to a semiconductor device.

BACKGROUND

It is desirable to improve the characteristics of a semiconductor device.

DETAILED DESCRIPTION

Figure 1:
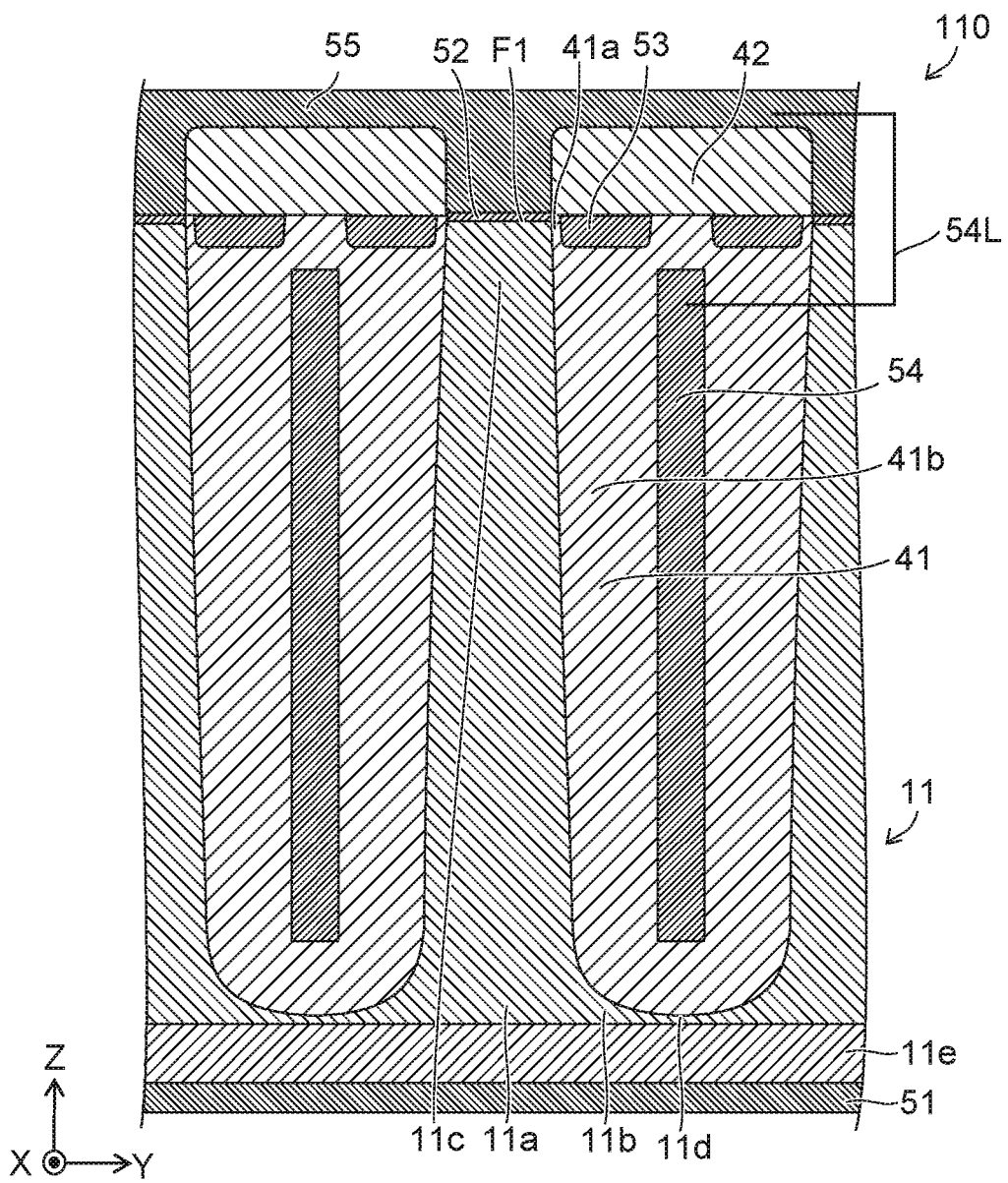
FIG. 1 is a schematic cross-sectional view illustrating a semiconductor device according to a first embodiment.

According to one embodiment, a semiconductor device includes a first conductive part, a second conductive part, a first semiconductor region, a third conductive part, and a first insulating part. A direction from the first conductive part toward the second conductive part is along a first direction. The first semiconductor region is of a first conductivity type. The first semiconductor region includes a first partial region, a second partial region, and a third partial region. A second direction from the first partial region toward the second partial region crosses the first direction. The third partial region is between the first partial region and the second conductive part in the first direction. The third partial region includes an opposing surface facing the second conductive part. The third partial region and the second conductive part have a Schottky contact. A direction from the opposing surface toward the third conductive part is along the second direction. The first insulating part includes a first insulating region. At least a portion of the first insulating region is between the opposing surface and the third conductive part.

According to one embodiment, a semiconductor device includes a first conductive part, a second conductive part, a first semiconductor region, a second semiconductor region, a third conductive part, and a first insulating part. A direction from the first conductive part toward the second conductive part is along a first direction. The first semiconductor region is of a first conductivity type. The first semiconductor region includes a first partial region, a second partial region, and a third partial region. A second direction from the first partial region toward the second partial region crosses the first direction. The third partial region is between the first partial region and the second conductive part in the first direction. The second semiconductor region is provided between the third partial region and the second conductive part. The second semiconductor region is of a second conductivity type. A direction from at least a portion of the second semiconductor region toward the third conductive part is along the second direction. The first insulating part includes a first insulating region. At least a portion of the first insulating region is between the third conductive part and the at least a portion of the second semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first conductive part 51, a second conductive part 52, a third conductive part 53, a first semiconductor region 11, and a first insulating part 41.

The direction from the first conductive part 51 toward the second conductive part 52 is along a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first semiconductor region 11 is of a first conductivity type. The first conductivity type is one of an n-type or a p-type. Hereinbelow, the first conductivity type is taken to be the n-type.

The first semiconductor region 11 includes a first partial region 11a, a second partial region 11b, and a third partial region 11c. A second direction from the first partial region 11a toward the second partial region 11b crosses the first direction. The second direction is, for example, a Y-axis direction.

The third partial region 11c is between the first partial region 11a and the second conductive part 52 in the first direction (the Z-axis direction). The third partial region 11c includes an opposing surface F1 facing the second conductive part 52. The third partial region 11c and the second conductive part 52 have a Schottky contact.

The direction from the opposing surface F1 toward the third conductive part 53 is along the second direction (e.g., the Y-axis direction).

The first insulating part 41 includes a first insulating region 41a. At least a portion of the first insulating region 41a is between the opposing surface F1 and the third conductive part 53. For example, the first insulating part 41 (e.g., the first insulating region 41a) electrically insulates the second conductive part 52 and the third conductive part 53. For example, the first insulating part 41 (e.g., the first insulating region 41a) electrically insulates the third partial region 11c and the third conductive part 53.

For example, the direction from a portion of the third partial region 11c toward the third conductive part 53 may be along the second direction (e.g., the Y-axis direction). The direction from at least a portion of the second conductive part 52 toward the third conductive part 53 may be along the second direction.

For example, a current that flows between the first conductive part 51 and the second conductive part 52 is controlled by controlling the potential of the third conductive part 53. For example, the first conductive part 51 functions as a drain electrode. The second conductive part 52 functions as at least a portion of a source electrode. For example, the third conductive part 53 functions as a gate electrode. For example, the first insulating region 41a functions as a gate insulating film. The semiconductor device 110 is, for example, a vertical transistor.

In the semiconductor device 110, a Schottky barrier is formed at the interface between the third partial region 11c and the second conductive part 52. The thickness (the distance in the Z-axis direction) of the Schottky barrier can be controlled by the potential of the third conductive part 53. A current substantially does not flow when the Schottky barrier is thick. An off-state is obtained thereby. By controlling the potential of the third conductive part 53, the Schottky barrier is made thinner, and, for example, a tunnel current flows. An on-state is obtained by the tunnel current flowing. According to the embodiment, a semiconductor device can be provided in which the characteristics can be improved.

For example, a vertical transistor of a reference example has a p-n-p structure. In such a case, a body diode that occurs in a contact portion of the source electrode includes a p-n junction. Therefore, a long period of time is necessary for recovery.

Conversely, in the embodiment, a region that includes the third partial region 11c and the second conductive part 52 (a region that includes the Schottky contact) becomes a body diode. Because the body diode is a Schottky diode in the embodiment, the recovery can be faster.

In the reference example in which the p-n-p structure is used, the gate electrode and a region including a first n$^-$-region, a p$^-$-region, and a second n$^-$-region face each other. Therefore, the gate length is long.

Conversely, in the embodiment, it is sufficient for the third conductive part 53 to face the interface (e.g., the opposing surface F1) between the third partial region 11c and the second conductive part 52. Therefore, the gate length is short. The total gate charge amount (Qg) is reduced thereby. The gate capacitance is small. High-speed switching is obtained thereby. The loss is small. For example, the gate capacitance (Cg) and the gate-drain capacitance (Cgd) are reduced. The total gate charge amount (Qg) and the gate-drain charge amount (Qgd) are reduced thereby. The loss of the gate driver can be reduced thereby. For example, the switching can be faster. For example, the turn-on loss and the turn-off loss can be suppressed.

The third conductive part 53 may face a portion of the third partial region 11c and a portion of the second conductive part 52 in addition to the opposing surface F1. For example, the thickness (the length along the first direction, i.e., the Z-axis direction) of the third conductive part 53 may be thin. The thickness of the third conductive part 53 may be, for example, 100 nm or less.

Considering alignment shift in the reference example in which the p-n-p structure is used, it is difficult to reduce the width (the length in the Y-axis direction) of the source contact portion. Therefore, it is difficult to reduce the pitch of the multiple source contacts.

Conversely, in the embodiment, a trench contact is unnecessary. It is sufficient to provide a structure in which the second conductive part 52 contacts the third partial region 11c. In the embodiment, it is easier to reduce the pitch of the multiple source contacts. For example, a compact low-resistance semiconductor device can be provided.

A reference example that uses a p-n-p structure may have a parasitic bipolar structure. For example, avalanche breakdown occurs easily when the hole current injected from the drain side becomes excessively large.

Conversely, in the embodiment, there is no parasitic bipolar structure. Therefore, for example, a high avalanche breakdown voltage is obtained.

Thus, according to the embodiment, a semiconductor device can be provided in which the characteristics can be improved.

As shown in FIG. 1, the first semiconductor region 11 may include a fourth partial region 11d and a fifth partial region 11e. The second partial region 11b is between the first partial region 11a and the fourth partial region 11d in the second direction (the Y-axis direction).

The fifth partial region 11e is provided between the first conductive part 51 and the first partial region 11a. In the example, the fifth partial region 11e is provided also between the first conductive part 51 and the second partial region 11b and between the first conductive part 51 and the fourth partial region 11d. The impurity concentration of the first conductivity type in the fifth partial region 11e is greater than the impurity concentration of the first conductivity type in the first partial region 11a. The fifth partial region 11e is, for example, an n$^+$-region. The first to fourth partial regions 11a to 11d are, for example, n$^-$-regions. By providing the fifth partial region 11e, a good electrical connection is obtained between the first semiconductor region 11 and the first conductive part 51.

As shown in FIG. 1, the semiconductor device 110 may include a fourth conductive part 54. The direction from the fourth partial region 11d toward the fourth conductive part 54 is along the first direction (the Z-axis direction). The direction from at least a portion of the third partial region 11c toward the fourth conductive part 54 is along the second direction (e.g., the Y-axis direction). The first insulating part 41 includes a second insulating region 41b. The second insulating region 41b is between the fourth conductive part 54 and at least a portion of the third partial region 11c in the second direction (e.g., the Y-axis direction). For example, the second insulating region 41b electrically insulates the third partial region 11c and the fourth conductive part 54.

For example, the fourth conductive part 54 is electrically connected to the second conductive part 52. Or, the fourth conductive part 54 may be capable of being electrically connected to the second conductive part 52. In the example, the fourth conductive part 54 is electrically connected to the second conductive part 52 via a fifth conductive part 55 by an interconnect 54L. A terminal may be provided in the interconnect 54L, and the terminal and the second conductive part 52 may be electrically connected outside the semiconductor device 110.

The potential of the fourth conductive part 54 is set to the potential of the second conductive part 52 (e.g., the source potential). By providing the fourth conductive part 54, the electric field in the first semiconductor region 11 can be controlled. For example, local electric field concentration can be suppressed. For example, high reliability is easily obtained.

As shown in FIG. 1, the second conductive part 52 is between the third partial region 11c and at least a portion of the fifth conductive part 55 in the first direction (the Z-axis direction). The fifth conductive part 55 is electrically connected to the second and fourth conductive parts 52 and 54.

As shown in FIG. 1, the semiconductor device 110 may include a second insulating part 42. The third conductive part 53 is between the second partial region 11b and the fifth conductive part 55 in the first direction (the Z-axis direction). At least a portion of the second insulating part 42 is between the third conductive part 53 and at least a portion of the fifth conductive part 55 in the first direction (the Z-axis direction). In the example, the third conductive part 53 is between the second insulating region 41b and at least a portion of the second insulating part 42 in the first direction.

In the embodiment, the first semiconductor region 11 may include, for example, at least one selected from the group consisting of silicon (Si), a nitride semiconductor (e.g., GaN, etc.), silicon carbide (SiC), and an oxide semiconductor (e.g., GaO). When the first semiconductor region 11 includes silicon, for example, the impurity of the first conductivity type includes at least one selected from the group consisting of phosphorus, arsenic, and antimony.

In one example, when the third partial region 11c of the first semiconductor region 11 includes silicon, the second conductive part 52 includes at least one selected from the group consisting of Ti, W, Mo, Ta, Zr, Al, Sn, V, Re, Os, Ir, Pt, Pd, Rh, Ru, Nb, Sr, and Hf.

The third conductive part 53 and the fourth conductive part 54 may include, for example, at least one of polysilicon or a metal. The fifth conductive part 55 includes, for example, at least one selected from the group consisting of Al, Cu, Mo, W, Ta, Co, Ru, Ti, and Pt. The first conductive part 51 includes, for example, Al, Cu, Mo, W, Ta, Co, Ru, Ti, Pt, etc.

Figure 2:
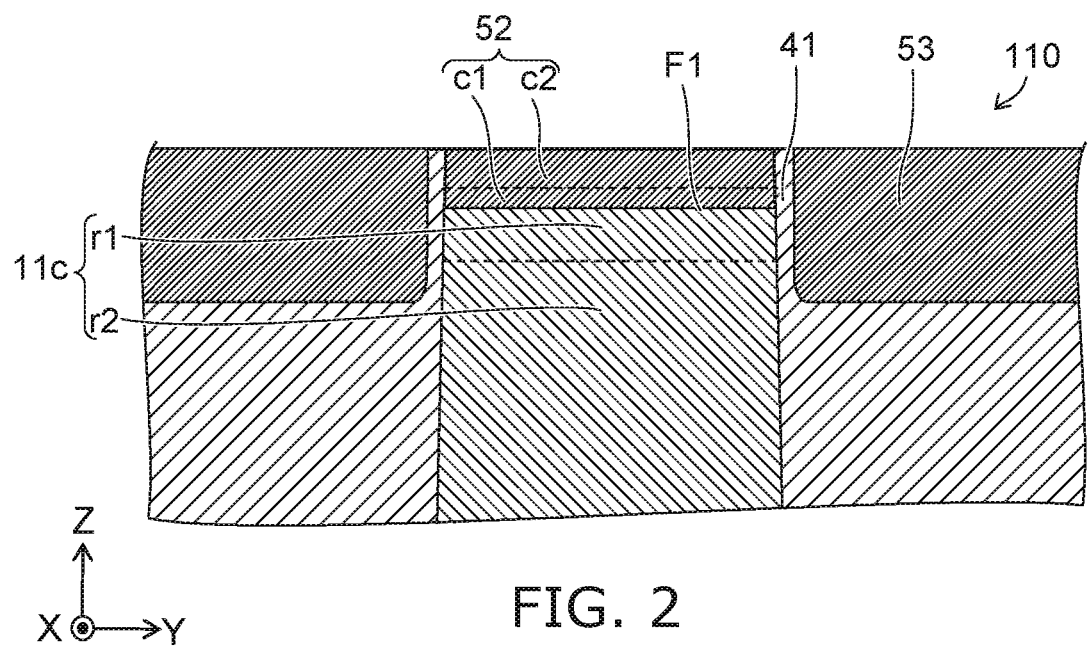
FIG. 2 is a schematic cross-sectional view illustrating a portion of the semiconductor device according to the first embodiment.

FIG. 2 is a schematic cross-sectional view illustrating a portion of the semiconductor device according to the first embodiment.

FIG. 2 is an enlarged view of a region including the second conductive part 52.

As shown in FIG. 2, the third partial region 11c may include a first region r1 and a second region r2. The first region r1 is between the second region r2 and the second conductive part 52 in the first direction (the Z-axis direction). The concentration of the impurity of the first conductivity type in the first region r1 is greater than the concentration of the impurity of the first conductivity type in the second region r2. The first region r1 is, for example, an $n^+$-region. The second region r2 is, for example, an $n^-$-region. The first region r1 is thin. In one example, the thickness along the first direction of the first region r1 is not less than 1 nm and not more than 20 nm.

By providing the first region r1, for example, the thickness (the length along the Z-axis direction) of the Schottky barrier in the on-state can be thin. The on-current can be increased thereby.

As shown in FIG. 2, the second conductive part 52 may include a first conductive region c1 and a second conductive region c2. The first conductive region c1 is between the third partial region 11c and the second conductive region c2 in the first direction (the Z-axis direction).

For example, the second conductive region c2 may include a first element. The third partial region 11c may include a second element. The first conductive region c1 may include a compound including the first and second elements. For example, the second conductive region c2 may include a first metallic element. The third partial region 11c may include silicon. The first conductive region c1 may include a silicide including the first metallic element. The first metallic element is, for example, at least one selected from the group consisting of Ti, W, Mo, Ta, Zr, Al, Sn, V, Re, Os, Ir, Pt, Pd, Rh, Ru, Nb, Sr, and Hf.

By providing the first conductive region c1 and the second conductive region c2 such as those described above, it is easy to form the first region r1 that includes the impurity of the first conductivity type with a high concentration.

In one example, a metal layer that is used to form the second conductive part 52 is formed on a silicon layer used to form the third partial region 11c. The metal layer includes an impurity of the first conductivity type. For example, a silicide region is formed in the portion of the metal layer at the silicon layer side by heat treatment, etc. At this time, the impurity that is included in the silicon layer before forming the silicide region moves downward from the silicide region (toward the first conductive part 51). Thereby, a region (e.g., the first region r1) that includes the impurity with a high concentration is formed in the portion of the third partial region 11c facing the silicide region.

In one example, a metal layer that is used to form the second conductive part 52 may be formed on a silicon layer used to form the third partial region 11c, and an impurity of the first conductivity type may be introduced to a portion of the silicon layer via the metal layer. A region (e.g., the first region r1) that includes the impurity with a high concentration is formed in the portion of the silicon layer facing the metal layer. For example, the concentration of the impurity of the first conductivity type in at least a portion of the second conductive region c2 may be greater than the concentration of the impurity in at least a portion of the first conductive region c1.

Figure 3:
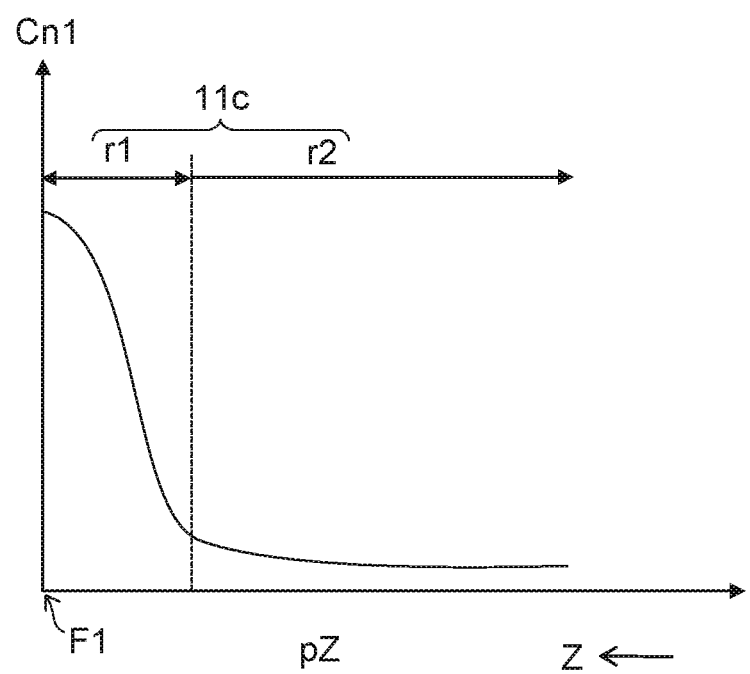
FIG. 3 is a schematic view illustrating a portion of the semiconductor device according to the first embodiment.

FIG. 3 is a schematic view illustrating a portion of the semiconductor device according to the first embodiment.

FIG. 3 illustrates the profile of the impurity in a region including the third partial region 11c and the second conductive part 52. The horizontal axis of FIG. 3 is a position pZ in the Z-axis direction. The vertical axis is a concentration Cn1 of the impurity of the first conductivity type.

As shown in FIG. 3, the concentration Cn1 of the impurity in the first region r1 is greater than the concentration Cn1 of the impurity in the second region r2.

Figure 4:
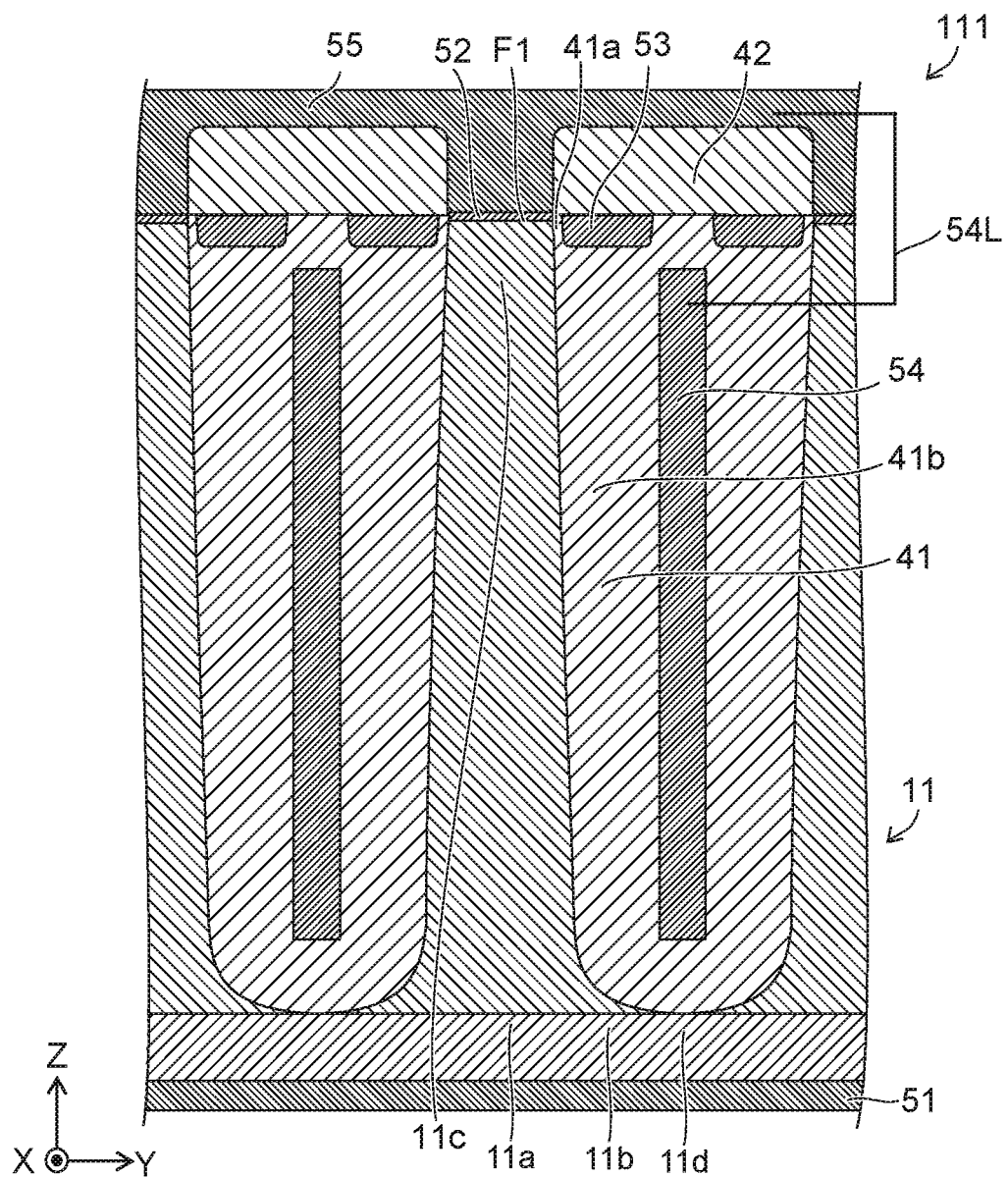
FIG. 4 is a schematic cross-sectional view illustrating a semiconductor device according to the first embodiment.

FIG. 4 is a schematic cross-sectional view illustrating a semiconductor device according to the first embodiment.

As shown in FIG. 4, the configuration of the first semiconductor region 11 in the semiconductor device 111 according to the embodiment differs from the configuration of the first semiconductor region 11 in the semiconductor device 110. Otherwise, the configuration of the semiconductor device 111 is similar to that of the semiconductor device 110.

In the semiconductor device 111, the impurity concentration of the first conductivity type in the fourth partial region 11d is greater than the impurity concentration of the first conductivity type in the third partial region 11c. For example, the impurity concentration of the first conductivity type in the first partial region 11a is greater than the impurity concentration of the first conductivity type in the third partial region 11c. For example, the impurity concentration of the first conductivity type in the second partial region 11b is greater than the impurity concentration of the first conductivity type in the third partial region 11c. In the semiconductor device 111 as well, a semiconductor device can be provided in which the characteristics can be improved.

Figure 5:
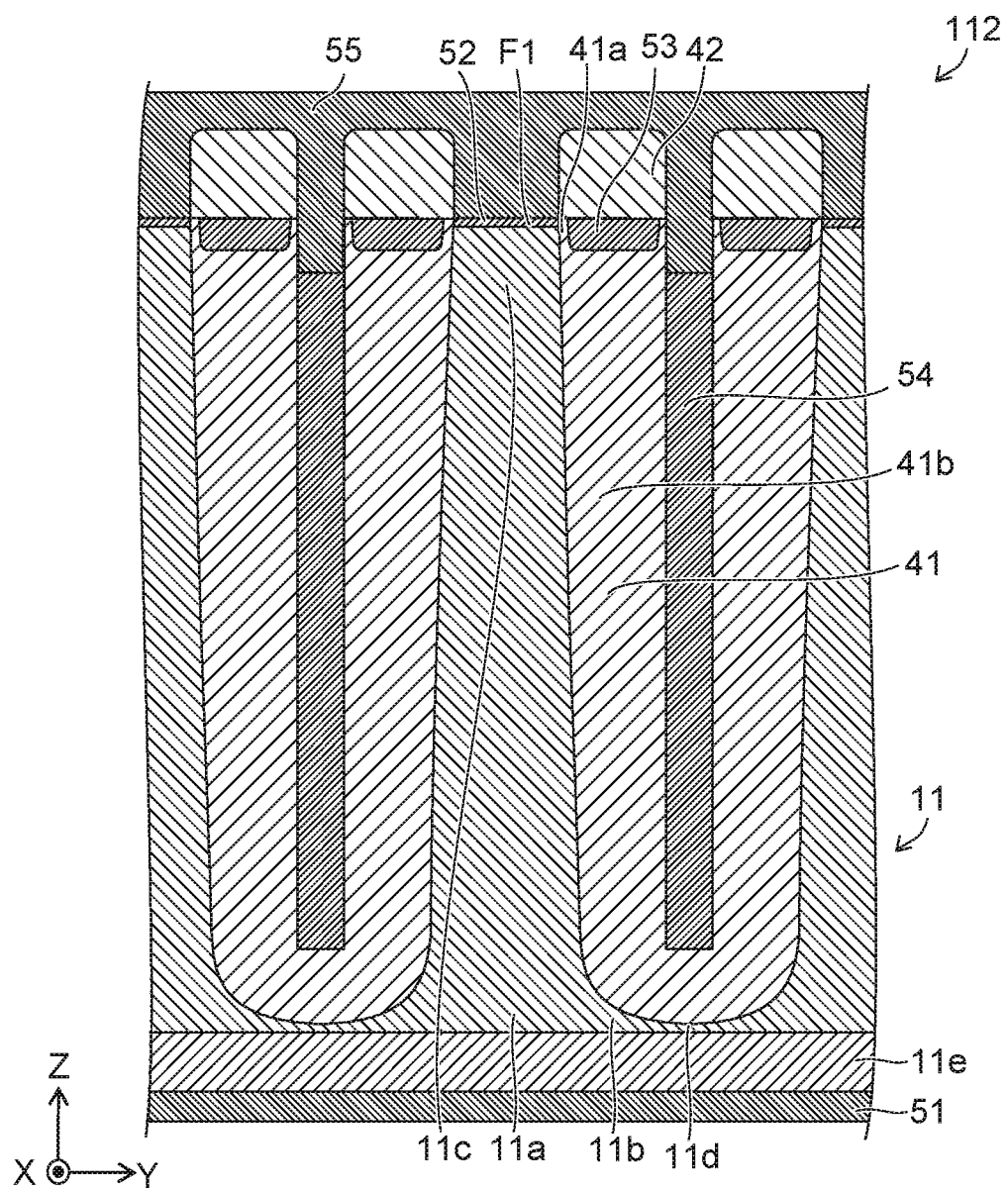
FIG. 5 is a schematic cross-sectional view illustrating a semiconductor device according to the first embodiment.

FIG. 5 is a schematic cross-sectional view illustrating a semiconductor device according to the first embodiment.

In the semiconductor device 112 according to the embodiment as shown in FIG. 5, the second insulating part 42 is provided at each of the multiple third conductive parts 53. For example, the fifth conductive part 55 passes between two second insulating parts 42 and contacts the fourth conductive part 54. Otherwise, the configuration of the semiconductor device 112 is similar to that of the semiconductor device 110. In the semiconductor device 112 as well, a semiconductor device can be provided in which the characteristics can be improved.

Figure 6:
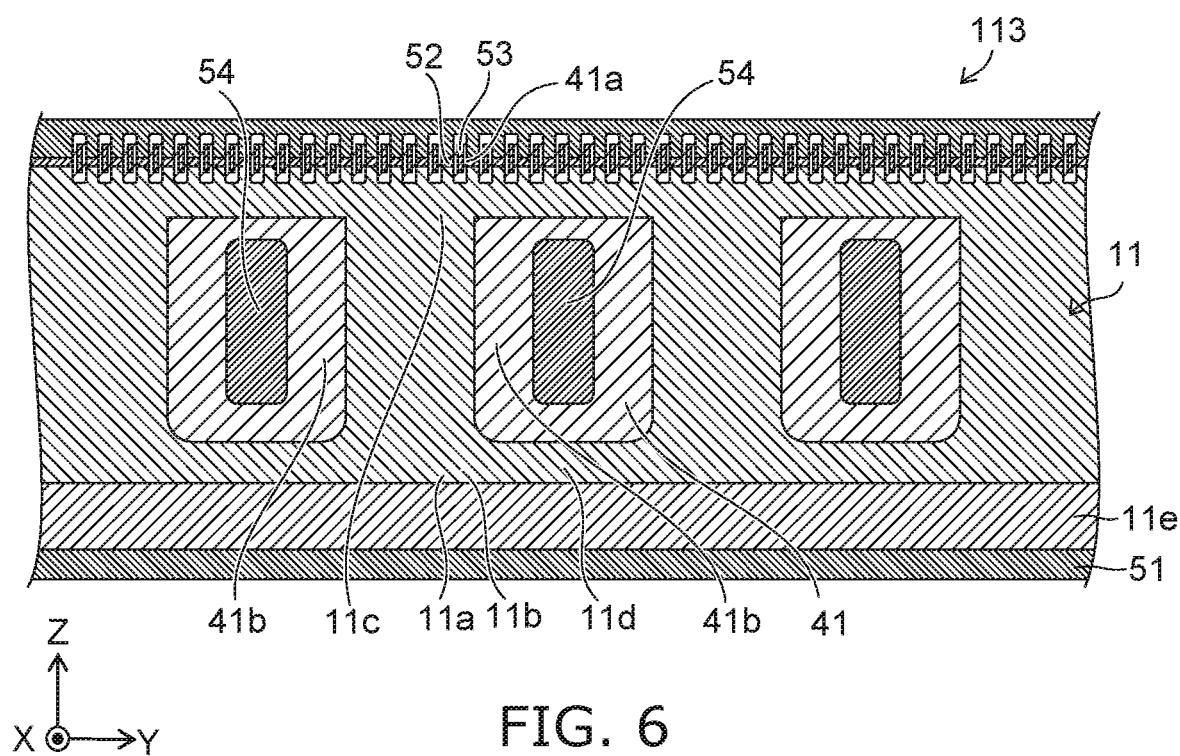
FIG. 6 is a schematic cross-sectional view illustrating a semiconductor device according to the first embodiment.

FIG. 6 is a schematic cross-sectional view illustrating a semiconductor device according to the first embodiment.

In the semiconductor device 113 according to the embodiment as shown in FIG. 6, a plurality of the structures illustrated in FIG. 1 is arranged in the Y-axis direction. In the example, the pitch of the multiple second conductive parts 52 is less than the pitch of the multiple fourth conductive parts 54. By using such a structure, for example, the on-resistance of the drift portion (e.g., the first semiconductor region 11) can be lowered while lowering the resistance in the on-state of the portion including the Schottky contact.

The multiple second conductive parts 52 and the multiple fourth conductive parts 54 are provided in the semiconductor device 113. The position in the second direction (the Y-axis direction) of one of the multiple second conductive parts 52 and the position in the second direction of another one of the multiple second conductive parts 52 are between the position in the second direction of one of the multiple fourth conductive parts 54 and the position in the second direction of another one of the multiple fourth conductive parts 54. The other one of the multiple fourth conductive parts 54 is next to the one of the multiple fourth conductive parts 54.

The semiconductor device 113 described above may be manufactured by separately making a portion including the fourth conductive parts 54 and a portion including the second conductive parts 52 and by bonding the two portions to each other.

Or, a portion that includes the second and third conductive parts 52 and 53 may be formed after forming a portion including the fourth conductive parts 54 by regrowing a semiconductor layer from the semiconductor region between the insulating parts. For example, the regrowth includes lateral growth. The semiconductor device 113 may be manufactured by such a technique.

Figure 7:
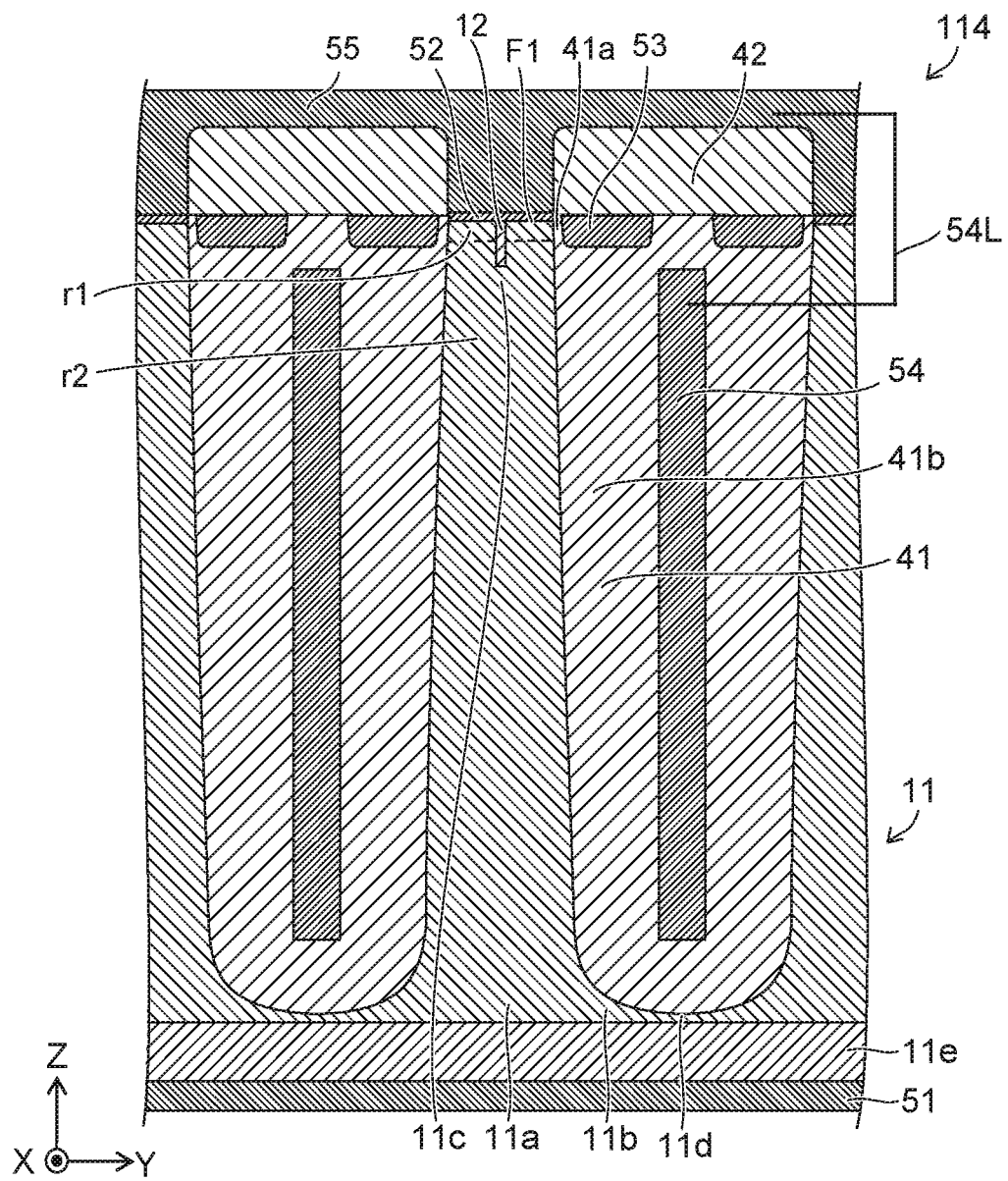
FIG. 7 is a schematic cross-sectional view illustrating a semiconductor device according to the first embodiment.

FIG. 7 is a schematic cross-sectional view illustrating a semiconductor device according to the first embodiment.

As shown in FIG. 7, the semiconductor device 114 according to the embodiment includes a second semiconductor region 12. Otherwise, the configuration of the semiconductor device 114 may be similar to that of the semiconductor device 110.

The second semiconductor region 12 is of a second conductivity type (e.g., the p-type). The second semiconductor region 12 is between the second conductive part 52 and a portion of the third partial region 11c in the first direction (the Z-axis direction). Another portion of the third partial region 11c is between the second semiconductor region 12 and the first insulating region 41a in the second direction (e.g., the Y-axis direction).

By providing the second semiconductor region 12, for example, the leakage current can be reduced. When the second semiconductor region 12 includes silicon, for example, the impurity of the second conductivity type includes at least one selected from the group consisting of boron, gallium, and indium.

Figure 8:
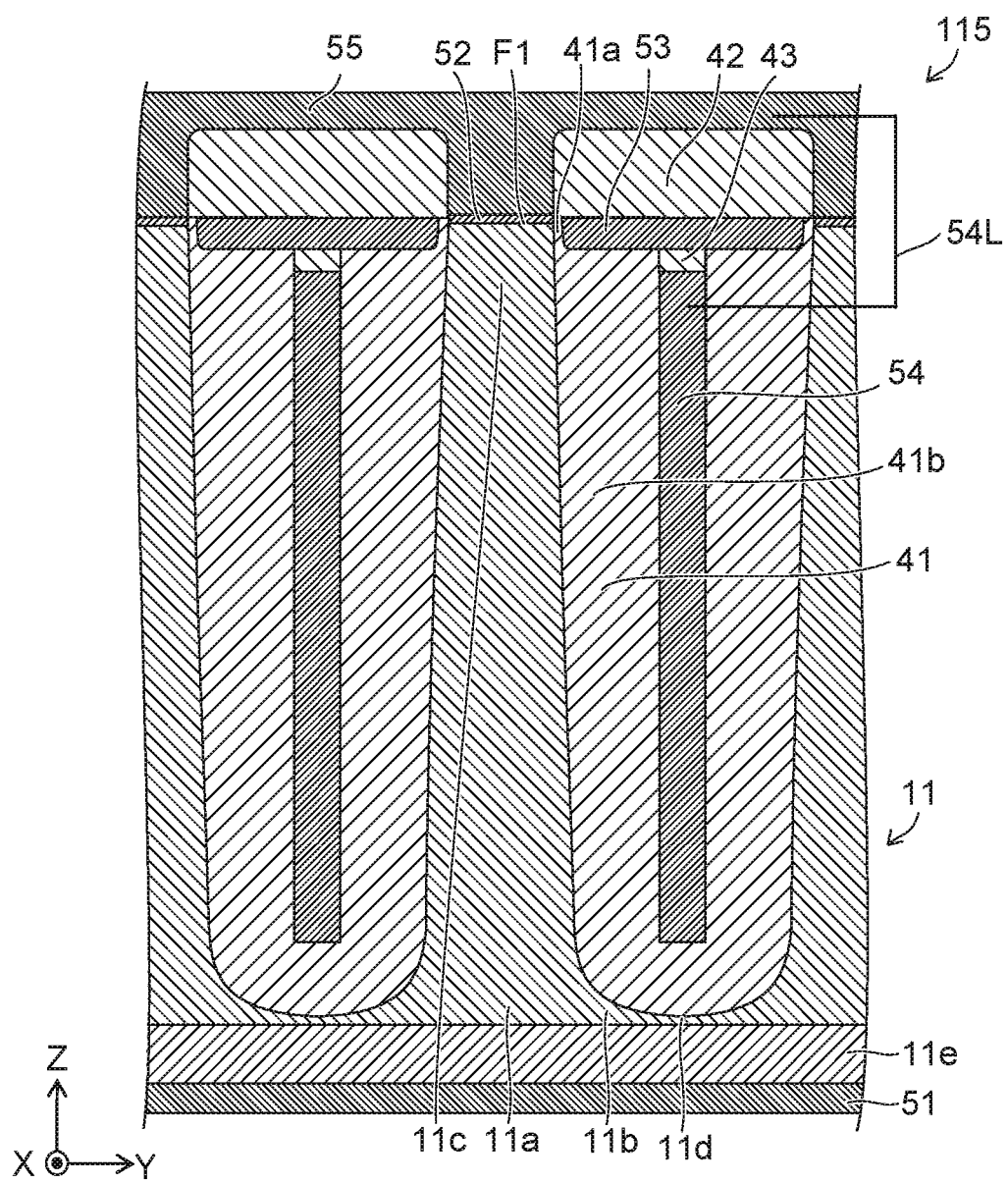
FIG. 8 is a schematic cross-sectional view illustrating a semiconductor device according to the first embodiment.

FIG. 8 is a schematic cross-sectional view illustrating a semiconductor device according to the first embodiment.

In the semiconductor device 115 according to the embodiment as shown in FIG. 8, one third conductive part 53 overlaps the fourth conductive part 54 and two regions of the first insulating part 41 in the Z-axis direction. A third insulating part 43 is provided between the fourth conductive part 54 and the third conductive part 53. Otherwise, the configuration of the semiconductor device 115 may be similar to that of the semiconductor device 110. In the semiconductor device 115 as well, a semiconductor device can be provided in which the characteristics can be improved.

Figure 9:
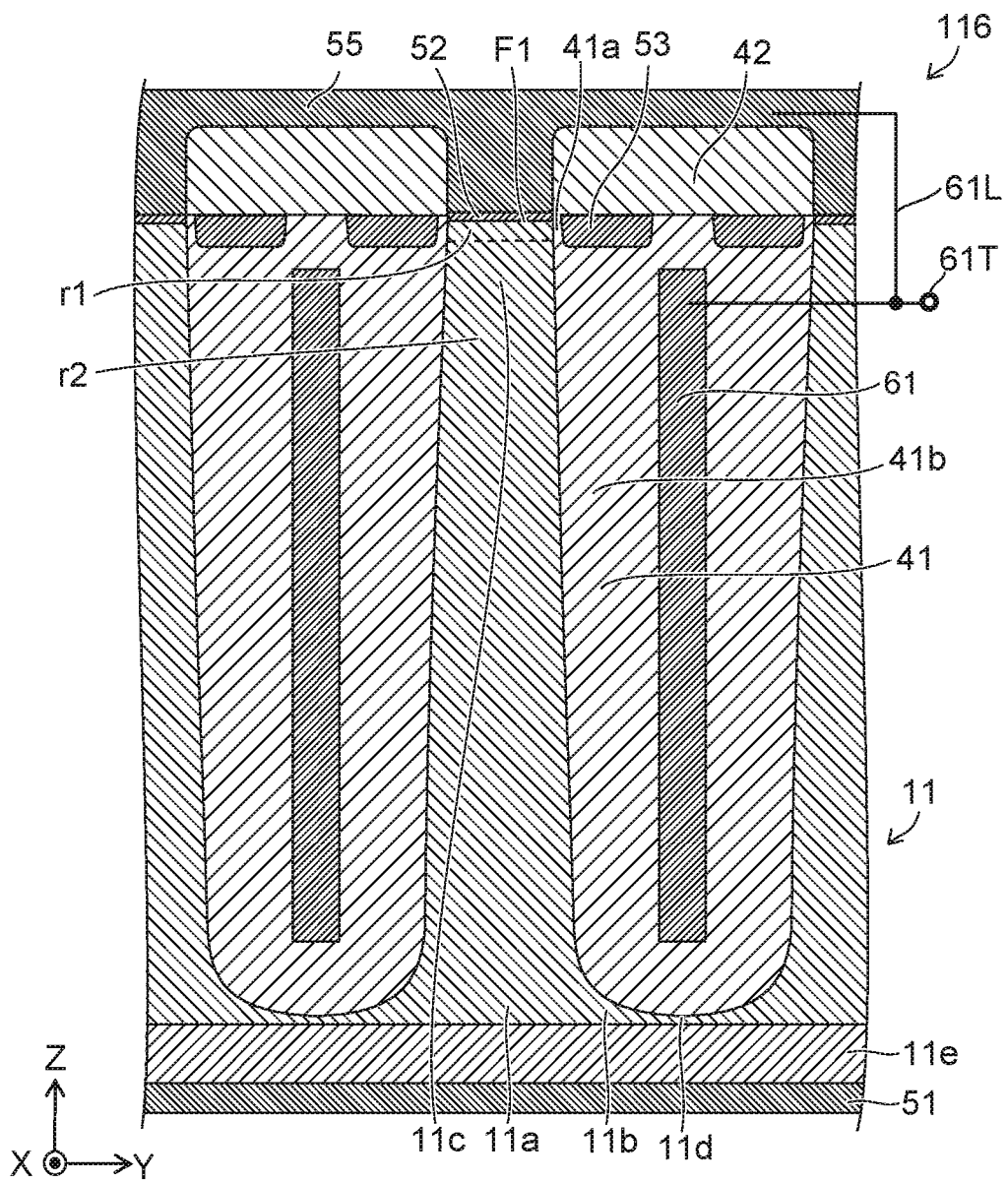
FIG. 9 is a schematic cross-sectional view illustrating a semiconductor device according to the first embodiment.

FIG. 9 is a schematic cross-sectional view illustrating a semiconductor device according to the first embodiment.

As shown in FIG. 9, the semiconductor device 116 according to the embodiment includes a first member 61 in addition to the first conductive part 51, the second conductive part 52, the third conductive part 53, the first semiconductor region 11, and the first insulating part 41. Otherwise, the configuration of the semiconductor device 116 may be similar to that of the semiconductor device 110.

As shown in FIG. 9, the first semiconductor region 11 includes the first to fourth partial regions 11a to 11d. In the example, the first semiconductor region 11 further includes the fifth partial region 11e. The second partial region 11b is between the first partial region 11a and the fourth partial region 11d in the second direction (the Y-axis direction). The direction from the fourth partial region 11d toward the first member 61 is along the first direction (the Z-axis direction). The direction from at least a portion of the third partial region 11c toward the first member 61 is along the second direction (the Y-axis direction). The first insulating part 41 includes the second insulating region 41b. The second insulating region 41b is between the first member 61 and at least a portion of the third partial region 11c in the second direction (the Y-axis direction).

For example, the first member 61 is electrically connected to the second conductive part 52. Or, the first member 61 is capable of being electrically connected to the second conductive part 52. For example, the first member 61 may be electrically connected to the second conductive part 52 via the fifth conductive part 55 by an interconnect 61L. For example, a terminal 61T may be provided in the interconnect 61L, and the terminal 61T and the second conductive part 52 may be connected outside the semiconductor device 116.

The resistivity of the first member 61 is greater than the resistivity of the fourth partial region 11d and less than the resistivity of the second insulating region 41b. For example, the resistivity of the first member 61 is not less than $5 \times 10^7$ Ωm and not more than $8 \times 10^{11}$ Ωm.

According to the embodiment, for example, it is possible for a micro current to flow in the first member 61 in the off-state. Thereby, for example, the electric field in the third partial region 11c can be made uniform. For example, a source-drain charge amount Qoss can be reduced. Thereby, for example, the loss can be suppressed. For example, the power consumption can be reduced. For example, the electric field that is applied to the gate insulating film can be reduced. For example, high reliability is obtained. According to the embodiment, for example, a semiconductor device can be provided in which the characteristics can be improved.

The first member 61 may include various materials such as the following. The first member 61 includes, for example, at least one selected from the group consisting of a first material, a second material, a third material, a fourth material, a fifth material, and a sixth material. The first material includes, for example, Si, N, and O.

The second material includes, for example, Si, N, and O. The second material includes, for example, a Si—N bond, a N—O bond, and a N—N bond. The second material includes, for example, oxygen-doped SIPOS (Semi-insulating Poly-crystalline Silicon). The second material is, for example, a mixed material of $SiH_4$, $N_2O$, and $N_2$.

The third material includes Si, N, and O. The third material includes, for example, a Si—N bond, a N—H bond, and a N—N bond. The third material is, for example, nitrogen-doped SIPOS. The third material is a mixed material of $SiH_4$, $NH_3$, and $N_2$.

The fourth material includes, for example, Si, C, and the first element. The first element includes at least one selected from the group consisting of B and N. The fifth material includes, for example, Si, O, and the second element. The second element includes at least one selected from the group consisting of Fe, Au, Ni, Ta, W, and Ti. The sixth material includes, for example, a third element and a fourth element. The third element includes at least one selected from the group consisting of In, Al, and Ga. The fourth element includes at least one selected from the group consisting of P, As, B, Fe, Au, Ni, Ti, Ta, W, and Ti.

By such materials, for example, the first member 61 can have an appropriate resistivity. Thereby, as described above, a semiconductor device can be provided in which the characteristics can be improved.

Second Embodiment

Figure 10:
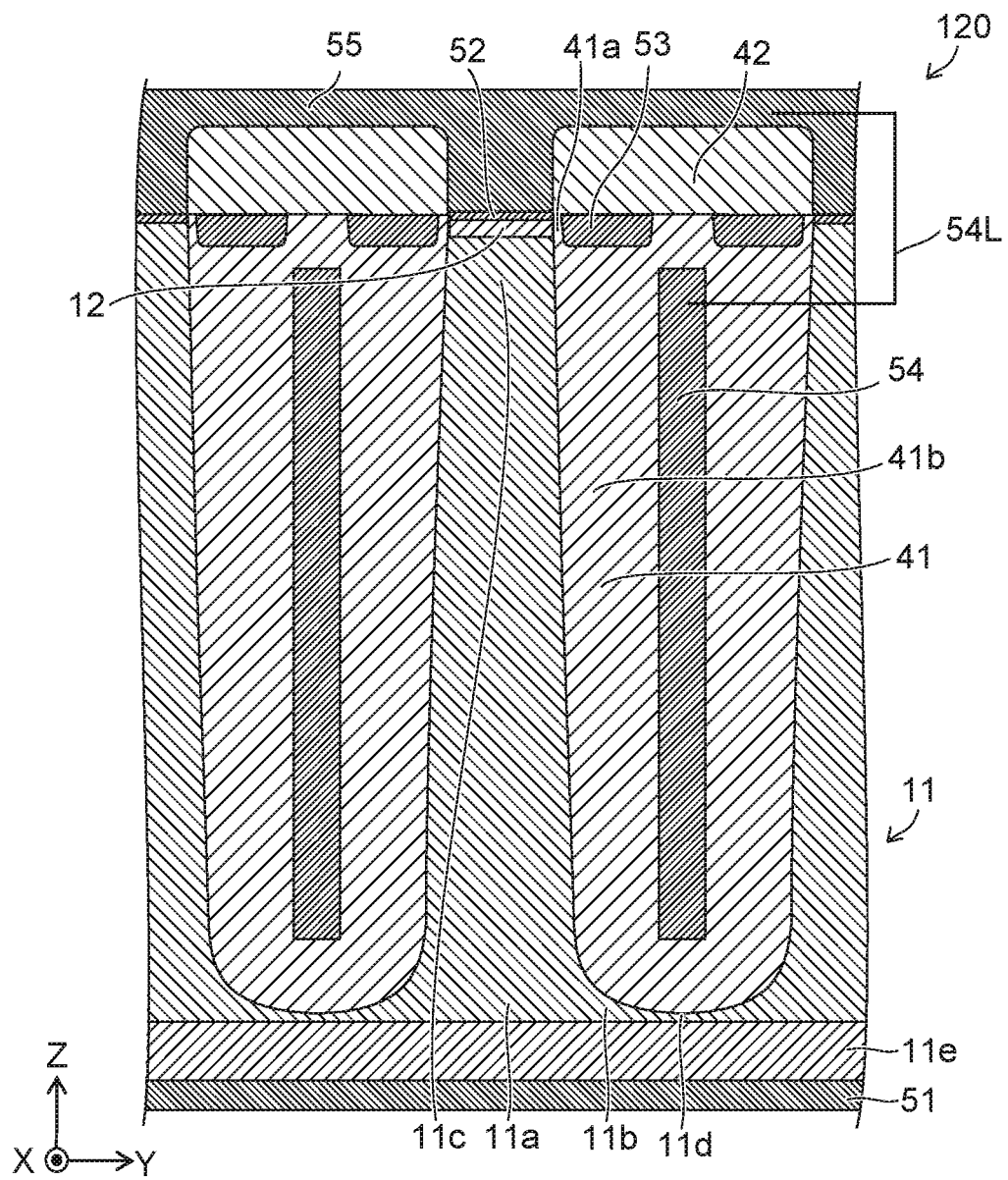
FIG. 10 is a schematic cross-sectional view illustrating a semiconductor device according to a second embodiment.

FIG. 10 is a schematic cross-sectional view illustrating a semiconductor device according to a second embodiment.

As shown in FIG. 10, the semiconductor device 120 according to the embodiment includes the first conductive part 51, the second conductive part 52, the first semiconductor region 11, the second semiconductor region 12, the third conductive part 53, and the first insulating part 41.

The direction from the first conductive part 51 toward the second conductive part 52 is along the first direction (the Z-axis direction).

The first semiconductor region 11 is of the first conductivity type (e.g., the n-type). The first semiconductor region 11 includes the first partial region 11a, the second partial region 11b, and the third partial region 11c. The second direction from the first partial region 11a toward the second partial region 11b crosses the first direction. The second direction is, for example, the Y-axis direction. The third partial region 11c is between the first partial region 11a and the second conductive part 52 in the first direction (the Z-axis direction).

The second semiconductor region 12 is provided between the third partial region 11c and the second conductive part 52. The second semiconductor region 12 is of the second conductivity type (e.g., the p-type). The direction from at least a portion of the second semiconductor region 12 toward the third conductive part 53 is along the second direction (e.g., the Y-axis direction). The first insulating part 41 includes the first insulating region 41a. At least a portion of the first insulating region 41a is between the third conductive part 53 and at least a portion of the second semiconductor region 12.

The semiconductor device 120 is, for example, a p-n-type transistor. The height of the barrier formed between the first semiconductor region 11 and the second semiconductor region 12 can be controlled by the potential of the third conductive part 53. In the semiconductor device 120 as well, for example, the total gate charge amount (Qg) is small. For example, the gate capacitance (Cg) and the gate-drain capacitance (Cgd) are reduced. The total gate charge amount (Qg) and the gate-drain charge amount (Qgd) are reduced thereby. For example, the loss of the gate driver can be reduced. For example, the switching can be faster. For example, the turn-on loss and the turn-off loss can be suppressed. A semiconductor device can be provided in which the characteristics can be improved.

In the semiconductor device 120, the second conductive part 52 may be continuous with the fifth conductive part 55. The second conductive part 52 may be a continuous body with the fifth conductive part 55.

Figure 11:
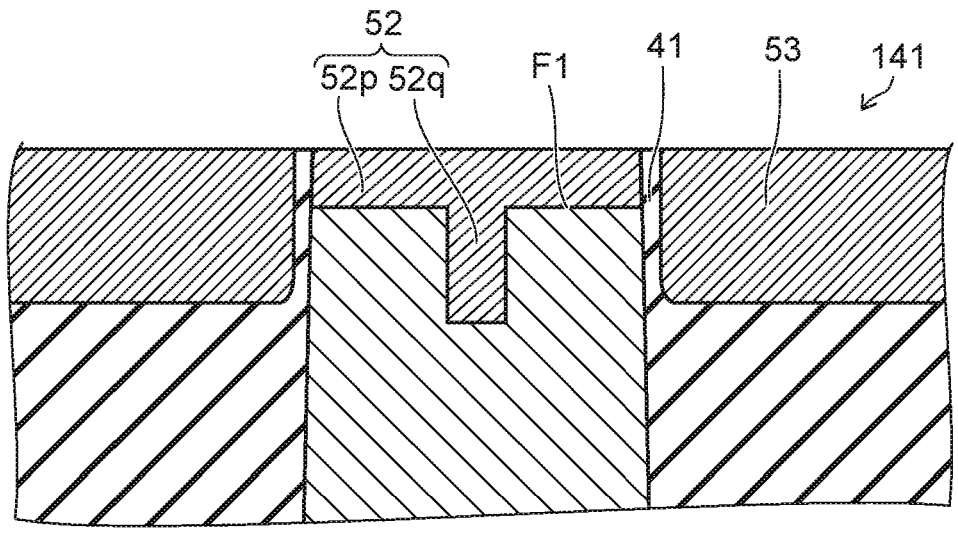
FIG. 11 is a schematic cross-sectional view illustrating a semiconductor device according to the embodiment.
Figure 12:
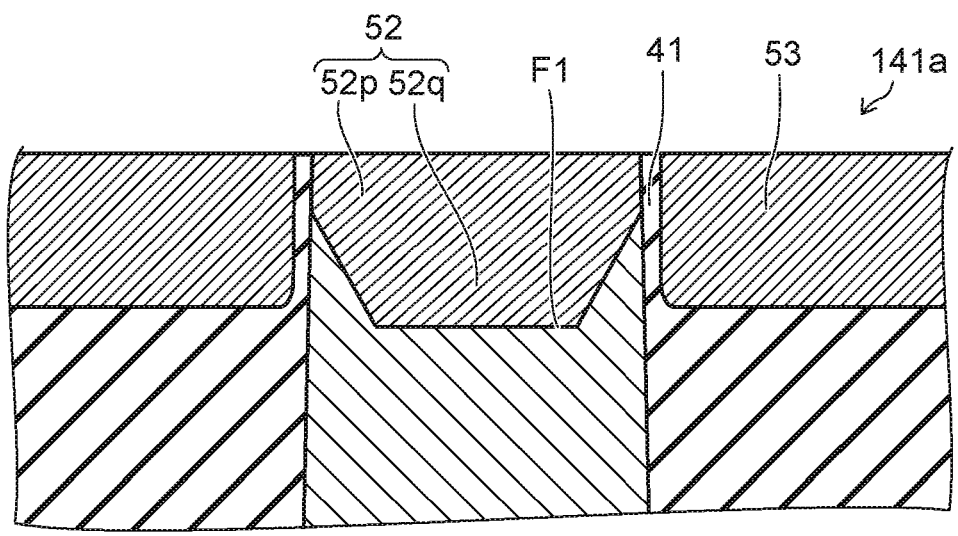
FIG. 12 is a schematic cross-sectional view illustrating a semiconductor device according to the embodiment.

FIG. 11 and FIG. 12 are schematic cross-sectional views illustrating semiconductor devices according to the embodiment.

As shown in FIG. 11 and FIG. 12, in the semiconductor devices 141 and 141a according to the embodiment, the second conductive part 52 includes a first conductive portion 52p and a second conductive portion 52q. The second conductive portion 52q is between the third partial region 11c and the first conductive portion 52p. For example, a direction from the second conductive portion 52q toward a portion of the third partial region 11c is along the Y-axis direction. For example, a direction from the second conductive portion 52q toward a portion of the third conductive part 53 is along the Y-axis direction. In this example, the second conductive portion 52q is between two portions of the third partial region 11c in the Y-axis direction. As the semiconductor devices 141a, a side face of the second conductive portion 52q may be inclined with respect to the Z-axis direction. In such a configuration as well, a semiconductor device can be obtained in which the characteristics can be improved. The configuration of the second conductive part 52 described with respect to the semiconductor device 141 may be applied to any semiconductor devices according to the first embodiment and the second embodiment.

According to the embodiment, a semiconductor device can be provided in which the characteristics can be improved.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as conductive parts, semiconductor regions, insulating parts, interconnects, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first conductive part;
a second conductive part, a direction from the first conductive part toward the second conductive part being along a first direction;
a first semiconductor region of a first conductivity type, the first semiconductor region including a first partial region, a second partial region, and a third partial region, a second direction from the first partial region toward the second partial region crossing the first direction, the third partial region being between the first partial region and the second conductive part in the first direction, the third partial region including an opposing surface facing the second conductive part, the third partial region and the second conductive part having a Schottky contact;
a third conductive part, a direction from the opposing surface toward the third conductive part being along the second direction; and
a first insulating part including a first insulating region, at least a portion of the first insulating region being between the opposing surface and the third conductive part, the first insulating region directly contacting the opposing surface.

2. The device according to claim 1, wherein
the first insulating region electrically insulates the second conductive part and the third conductive part and electrically insulates the third partial region and the third conductive part.

3. The device according to claim 1, wherein
a direction from a portion of the third partial region toward the third conductive part is along the second direction, and
a direction from at least a portion of the second conductive part toward the third conductive part is along the second direction.

4. The device according to claim 1, wherein
the third partial region includes a first region and a second region,
the first region is between the second region and the second conductive part in the first direction, and
a concentration of an impurity of the first conductivity type in the first region is greater than a concentration of an impurity of the first conductivity type in the second region.

5. The device according to claim 4, wherein
a thickness along the first direction of the first region is not less than 1 nm and not more than 20 nm.

6. The device according to claim 1, wherein
the second conductive part includes a first conductive region and a second conductive region,
the first conductive region is between the first partial region and the second conductive region in the first direction,
the second conductive region includes a first element,
the third partial region includes a second element, and
the first conductive region includes a compound including the first element and the second element.

7. The device according to claim 1, wherein
the second conductive part includes a first conductive region and a second conductive region,
the first conductive region is between the third partial region and the second conductive region in the first direction,
the second conductive region includes a first metallic element,
the third partial region includes silicon, and
the first conductive region includes a silicide including the first metallic element.

8. The device according to claim 7, wherein
a concentration of an impurity of the first conductivity type in at least a portion of the second conductive region is greater than a concentration of the impurity in at least a portion of the first conductive region.

9. The device according to claim 1, further comprising:
a fourth conductive part,
the first semiconductor region further including a fourth partial region,
the second partial region being between the first partial region and the fourth partial region in the second direction,
a direction from the fourth partial region toward the fourth conductive part being along the first direction,
a direction from at least a portion of the third partial region toward the fourth conductive part being along the second direction,
the first insulating part including a second insulating region,
the second insulating region being between the fourth conductive part and the at least a portion of the third partial region in the second direction.

10. The device according to claim 9, wherein
the fourth conductive part is electrically connected to the second conductive part.

11. The device according to claim 9, further comprising:
a fifth conductive part,
the second conductive part being between the third partial region and at least a portion of the fifth conductive part in the first direction, the fifth conductive part being electrically connected to the second and fourth conductive parts.

12. The device according to claim 11, further comprising:
a second insulating part,
the third conductive part being between the second partial region and the fifth conductive part in the first direction,
at least a portion of the second insulating part being between the third conductive part and at least a portion of the fifth conductive part in the first direction.

13. The device according to claim 9, comprising:
a plurality of the second conductive parts; and
a plurality of the fourth conductive parts,
a position in the second direction of one of the second conductive parts and a position in the second direction of an other one of the second conductive parts being between a position in the second direction of one of the fourth conductive parts and a position in the second direction of an other one of the fourth conductive parts, the other one of the fourth conductive parts being next to the one of the fourth conductive parts.

14. The device according to claim 9, wherein
an impurity concentration of the first conductivity type in the fourth partial region is greater than an impurity concentration of the first conductivity type in the third partial region.

15. The device according to claim 1, wherein
the first semiconductor region includes a fifth partial region,
the fifth partial region is provided between the first conductive part and the first partial region, and
an impurity concentration of the first conductivity type in the fifth partial region is greater than an impurity concentration of the first conductivity type in the first partial region.

16. The device according to claim 1, further comprising:
a second semiconductor region of a second conductivity type,
the second semiconductor region being between the second conductive part and a portion of the third partial region in the first direction,
an other portion of the third partial region being between the second semiconductor region and the first insulating region in the second direction.

17. The device according to claim 1, further comprising:
a first member,
the first semiconductor region further including a fourth partial region,
the second partial region being between the first partial region and the fourth partial region in the second direction,
a direction from the fourth partial region toward the first member being along the first direction,
a direction from at least a portion of the third partial region toward the first member being along the second direction,
the first insulating part including a second insulating region,
the second insulating region being between the first member and the at least a portion of the third partial region in the second direction,
the first member being electrically connected to the fourth partial region,
the first member being electrically connected to the second conductive part or capable of being electrically connected to the second conductive part,
a resistivity of the first member being greater than a resistivity of the fourth partial region and less than a resistivity of the second insulating region.

18. The device according to claim 1, further comprising:
a first member,
a direction from the second partial region toward the first member being along the first direction,
a direction from at least a portion of the third partial region toward the first member being along the second direction,
the first insulating part including a second insulating region,
the second insulating region being between the first member and the at least a portion of the third partial region in the second direction,
the first member being electrically connected to the fourth partial region,
the first member being electrically connected to the second conductive part or capable of being electrically connected to the second conductive part,
the first member including at least one selected from the group consisting of a first material, a second material, a third material, a fourth material, a fifth material, and a sixth material,
the first material including Si, N, and O,
the second material including a Si—N bond, a N—O bond, and a N—N bond,
the third material including a Si—N bond, a N—H bond, and a N—N bond,
the fourth material including Si, C, and a first element, the first element including at least one selected from the group consisting of B and N,
the fifth material including Si, O, and a second element, the second element including at least one selected from the group consisting of Fe, Au, Ni, Ta, W, and Ti,
the sixth material including a third element and a fourth element, the third element including at least one selected from the group consisting of In, Al, and Ga, the fourth element including at least one selected from the group consisting of P, As, B, Fe, Au, Ni, Ti, Ta, W, and Ti.

19. A semiconductor device, comprising:
a first conductive part;
a second conductive part, a direction from the first conductive part toward the second conductive part being along a first direction;
a first semiconductor region of a first conductivity type, the first semiconductor region including a first partial region, a second partial region, and a third partial region, a second direction from the first partial region toward the second partial region crossing the first direction, the third partial region being between the first partial region and the second conductive part in the first direction, the third partial region including an opposing surface facing the second conductive part;
a second semiconductor region provided between the third partial region and the second conductive part, the second semiconductor region being of a second conductivity type;
a third conductive part, a direction from at least a portion of the second semiconductor region toward the third conductive part being along the second direction; and
a first insulating part including a first insulating region, at least a portion of the first insulating region being between the third conductive part and the at least a portion of the second semiconductor region, the first insulating region directly contacting the opposing surface.

* * * * *